(12) United States Patent
Kao et al.

(10) Patent No.: US 10,008,532 B2
(45) Date of Patent: Jun. 26, 2018

(54) IMPLANT ISOLATED DEVICES AND METHOD FOR FORMING THE SAME

(71) Applicant: Taiwan Semiconductor Manufacturing Company, Ltd., Hsin-Chu (TW)

(72) Inventors: Min-Feng Kao, Chiayi (TW); Dun-Nian Yaung, Taipei (TW); Jen-Cheng Liu, Hsin-Chu (TW); Tzu-Hsuan Hsu, Kaohsiung (TW); Wen-De Wang, Minsyong Township (TW); Wen-I Hsu, Tainan (TW)

(73) Assignee: Taiwan Semiconductor Manufacturing Company, Ltd., Hsin-Chu (TW)

( * ) Notice: Subject to any disclaimer, the term of this patent is extended or adjusted under 35 U.S.C. 154(b) by 0 days. days.

(21) Appl. No.: 15/135,099

(22) Filed: Apr. 21, 2016

(65) Prior Publication Data

US 2016/0233257 A1    Aug. 11, 2016

Related U.S. Application Data

(62) Division of application No. 13/632,606, filed on Oct. 1, 2012, now Pat. No. 9,355,888.

(51) Int. Cl.
| | |
|---|---|
| *H01L 29/78* | (2006.01) |
| *H01L 27/146* | (2006.01) |
| *H01L 21/762* | (2006.01) |
| *H01L 29/06* | (2006.01) |
| *H01L 29/49* | (2006.01) |

(Continued)

(52) U.S. Cl.
CPC .... *H01L 27/1463* (2013.01); *H01L 21/26513* (2013.01); *H01L 21/76237* (2013.01); *H01L 27/14643* (2013.01); *H01L 27/14689* (2013.01); *H01L 29/0649* (2013.01); *H01L 29/4916* (2013.01); *H01L 29/78* (2013.01); *H01L 21/2652* (2013.01); *H01L 21/76* (2013.01); *H01L 27/146* (2013.01)

(58) Field of Classification Search
None
See application file for complete search history.

(56) References Cited

U.S. PATENT DOCUMENTS

| 921,924 A | 5/1909 | Wales |
|---|---|---|
| 4,001,048 A | 1/1977 | Meiling et al. |

(Continued)

FOREIGN PATENT DOCUMENTS

| KR | 20040008056 | 1/2004 |
|---|---|---|
| KR | 100597125 | 7/2006 |

(Continued)

*Primary Examiner* — Abul Kalam
(74) *Attorney, Agent, or Firm* — Slater Matsil, LLP

(57) ABSTRACT

A device includes a semiconductor substrate and implant isolation region extending from a top surface of the semiconductor substrate into the semiconductor substrate surrounding an active region. A gate dielectric is disposed over an active region of the semiconductor substrate and extends over the implant isolation region. A gate electrode is disposed over the gate dielectric and two end cap hardmasks are between the gate dielectric and the gate electrode over the implant isolation region. The two end cap hardmasks include same dopants as those implanted into the active region.

20 Claims, 13 Drawing Sheets

(51) Int. Cl.
*H01L 21/265* (2006.01)
*H01L 21/76* (2006.01)

(56) References Cited

U.S. PATENT DOCUMENTS

| | | |
|---|---|---|
| 5,290,714 A | 3/1994 | Onozawa |
| 6,011,290 A | 1/2000 | Gardner et al. |
| 6,448,163 B1 | 9/2002 | Holbrook et al. |
| 7,800,146 B2 | 9/2010 | McKee et al. |
| 8,530,975 B2 * | 9/2013 | Kim ............ H01L 21/28114 257/345 |
| 2002/0117698 A1 | 8/2002 | Inumiya et al. |
| 2004/0058489 A1 | 3/2004 | Arai |
| 2004/0104404 A1 | 6/2004 | Bito |
| 2004/0173824 A1 | 9/2004 | Nagasaki et al. |
| 2005/0269644 A1 | 12/2005 | Brask et al. |
| 2006/0081942 A1 | 4/2006 | Saito |
| 2006/0148195 A1 | 7/2006 | Hwang |
| 2006/0186487 A1 * | 8/2006 | Lee ............ H01L 21/28123 257/411 |
| 2007/0252240 A1 | 11/2007 | Andresen et al. |
| 2008/0012080 A1 | 1/2008 | Yaegashi |
| 2008/0057612 A1 | 3/2008 | Doan et al. |
| 2009/0090985 A1 * | 4/2009 | Kim ............ H01L 21/28114 257/409 |
| 2009/0191697 A1 | 7/2009 | Lee |
| 2010/0022077 A1 | 1/2010 | Krull et al. |
| 2010/0052019 A1 | 3/2010 | Yamamoto et al. |
| 2010/0117148 A1 * | 5/2010 | Kim ............ H01L 21/28114 257/330 |
| 2012/0326233 A1 | 12/2012 | Wang et al. |
| 2013/0277719 A1 | 10/2013 | Kao et al. |

FOREIGN PATENT DOCUMENTS

| | | |
|---|---|---|
| KR | 20060077707 | 7/2006 |
| KR | 100650777 | 11/2006 |
| KR | 20080038434 | 5/2008 |
| KR | 20090045294 | 5/2009 |
| KR | 20090082627 | 7/2009 |
| TW | 560005 | 11/2003 |
| TW | 200416901 | 9/2004 |

\* cited by examiner

IMPLANT ISOLATED DEVICES AND METHOD FOR FORMING THE SAME

PRIORITY CLAIM

This application claims the benefit to and is a divisional of U.S. patent application Ser. No. 13/632,606, filed on Oct. 1, 2012, and entitled "Implant Isolated Devices and Method for Forming the Same", which application is incorporated herein by reference.

FIELD

The present disclosure relates generally to semiconductor devices and manufacturing processes. More particularly, it relates to semiconductor devices having an implant isolation and processes for forming these devices.

BACKGROUND

In the manufacturing of integrated circuits, the sizes of integrated circuit devices are scaled down increasingly. For example, Complementary Metal-Oxide-Semiconductor (CMOS) Image Sensor (CIS) chips have increasingly smaller pixel sizes. Accordingly, the requirement in the DC and noise performance of the CIS chips becomes increasingly stricter. Implant isolation regions formed by well implantation are thus replacing the conventional Shallow Trench Isolation (STI) regions to isolate devices. With the formation of the implant isolation regions using implantation rather than STI regions, the damage to silicon surfaces caused by the formation of the STI regions is eliminated.

The implant isolation regions are formed by implanting an impurity to portions of a substrate, which portions surround the active regions of the integrate circuit devices that are to be isolated. It is difficult to control the accuracy in the overlay of the components of the integrated circuit devices with the implant isolation regions. If the gate electrodes are misaligned to the implant isolation regions, gate electrodes may not be able to fully separate the channel between the source and drain regions of the devices, forming a leakage path. Under high voltage application to a gate electrode over the implant isolation region, a parasitic transistor may develop.

BRIEF DESCRIPTION OF THE DRAWINGS

For a more complete understanding of the embodiments, and the advantages thereof, reference is now made to the following descriptions taken in conjunction with the accompanying drawings, in which.

DETAILED DESCRIPTION OF ILLUSTRATIVE EMBODIMENTS

Figure 1:
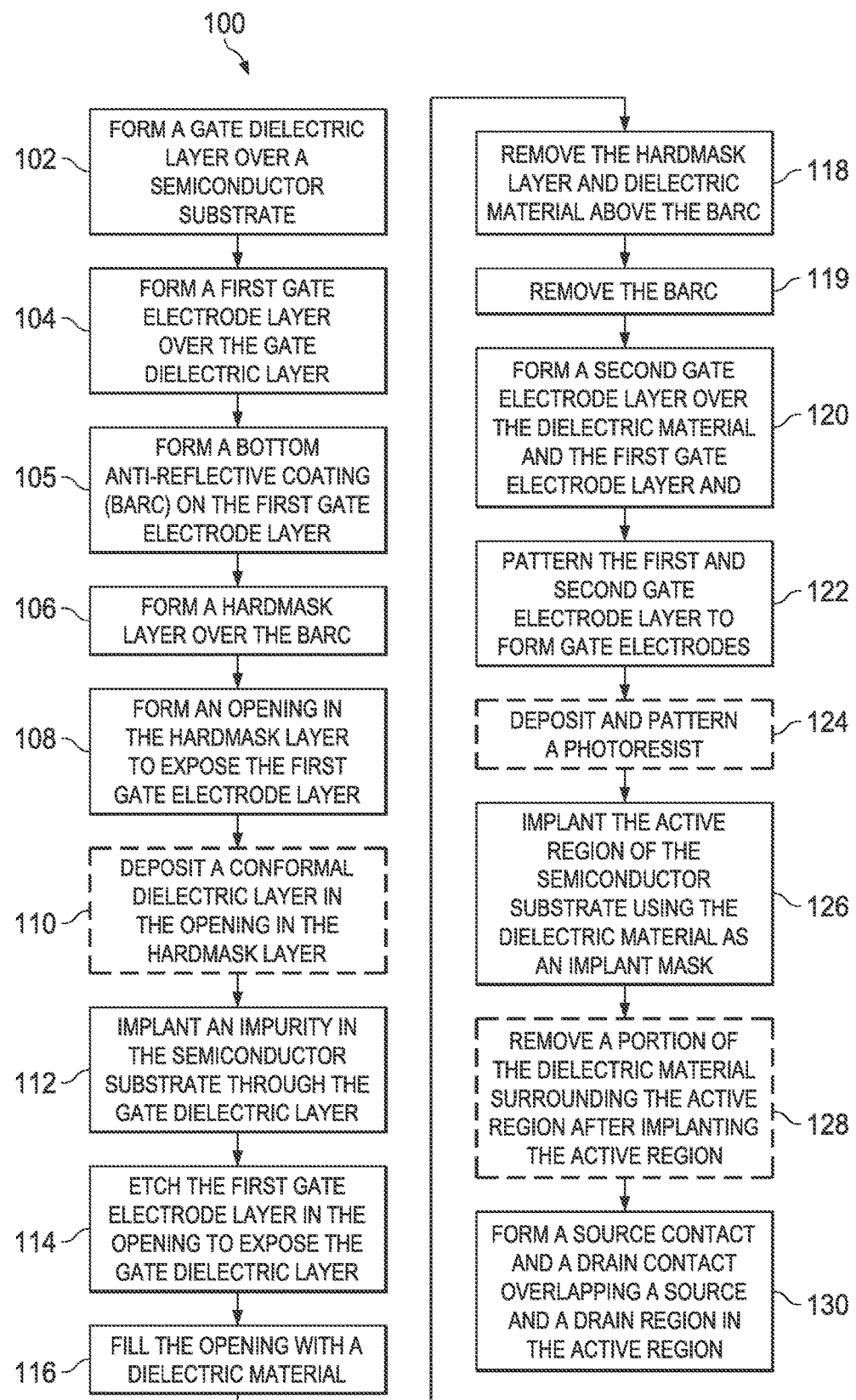
FIG. 1 is a flowchart of various method embodiments for making a semiconductor structure having implant isolation region according to various aspects of the present disclosure.

The making and using of the embodiments of the disclosure are discussed in detail below. It should be appreciated, however, that the embodiments provide many applicable inventive concepts that can be embodied in a wide variety of specific contexts. The specific embodiments discussed are illustrative, and do not limit the scope of the disclosure.

A method of forming implant isolation regions and one or more semiconductor devices at an active region adjacent the implant isolation regions are provided in accordance with various exemplary embodiments. The intermediate stages of forming the implant isolation regions and the devices are illustrated. The variations of the embodiments are discussed. Throughout the various views and illustrative embodiments, like reference numbers are used to designate like elements.

Implant isolation regions are used to isolate electronic components formed in semiconductors from each other. These electronic components include diodes, such as photodiodes and Schottky diodes, transistors, such as field-effect transistors, bipolar junction transistors, and insulated gate bipolar transistors, and other electronic components such as rectifiers, thyristors, and capacitors. These electronic components together or by themselves are semiconductor devices used in various applications. For example, a pixel in an image sensor includes one or more photodiodes and three or more transistors connected to the one or more photodiodes. In another example, a number of transistors, usually six or eight, are used to form one bit of a static random-access memory.

An implant isolation region surrounding a transistor is formed by implanting a semiconductor substrate with a dopant of a conductivity type opposite that of the conductivity type of the active region of the transistor. A gate structure is formed across the active region to control the transistor. During normal operation, the implant isolation region prevents currents from leaking through ends of the gate structure and eliminates noise effects from other electronic components. To ensure no current would bridge a channel region of the transistor, the gate structure is formed with end caps on both ends that at least partially overlap the isolation region surrounding the transistor. Without end caps, a small misalignment would expose a portion of the channel region that can be bridged as a leakage path. However, the use of the end caps on the implant isolation region can cause a formation of a parasitic transistor when high voltage is applied to the gate. Specifically, the parasitic transistor would include the end cap as the gate and the implant isolation region under the end cap as a channel region and divert energy from its host transistor. The parasitic transistor would impact performance of the host transistor by reducing effective channel width and creating an interfering electric field. If the parasitic transistor forms, the threshold voltage for the host transistor would increase and power consumption would increase.

Semiconductor devices using an implant isolation region that reduces or eliminates the likelihood of forming a parasitic transistor are disclosed accordance with various embodiments of the present disclosure. Methods for making the semiconductor device are also disclosed. An end cap hardmask is used in between the implant isolation region and portions of the gate electrode over the implant isolation region to reduce the likelihood of forming a channel region of a parasitic transistor. The end cap hardmask is also used as an implant mask for implanting the active region. An opening is formed first in a mask stack for implanting dopants into the implant isolation region at the bottom of the opening. The dopants may travel through one or more layers of the mask stack, which includes a gate electrode layer and a gate dielectric layer. Then a dielectric material is deposited in the opening and materials above a first gate electrode layer are selectively removed to leave a protruding portion of the dielectric material above the first gate electrode layer. As formed, the dielectric material and the implant isolation regions are self-aligned. A second gate electrode layer is formed over the dielectric material and the first gate electrode layer. The second gate electrode layer may be not planar due to the dielectric material protrusions. The gate electrode is then patterned and formed. The gate electrode includes end cap portions on the ends of the gate electrode at least partially over the implant isolation region on the dielectric material. The active region is implanted using the dielectric material as an implant mask around the active region. Portions of the dielectric material may be optionally removed. In some embodiments, the implantation is performed between two hardmask depositions to reduce the critical dimensions of the implant isolation region.

Figure 2A:
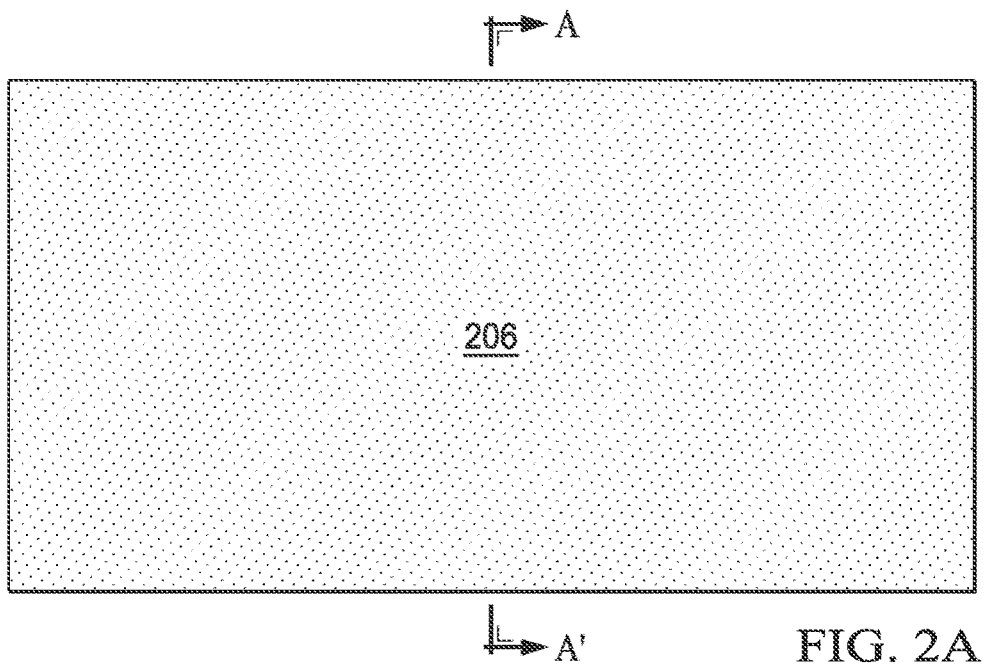
FIGS. 2A and 2B are top views and cross-sectional views of intermediate stages in the manufacturing of a device in accordance with some embodiments.

FIG. 1 is a flowchart of various method embodiments for making a semiconductor structure having implant isolation region according to various aspects of the present disclosure. FIGS. 2A/2B to FIGS. 12A/12B are top views and cross-sectional views of intermediate stages in the manufacturing of a device in accordance with some operations of various method embodiments shown in the flowchart of FIG. 1. Figures having "A" designation are top views that show a cut line A-A'. The cut line A-A' is the cut-plane of the cross-sectional view of figures having a "B" designation. All subsequent figures having the "A" and "B" designation have the same cut line, which description is not repeated for every figure. Note that the various figures used to illustrate the various embodiments are not drawn to scale. In the present disclosure, a wafer refers to a partially fabricated workpiece that includes a substrate and various layers in or over the substrate.

Figure 2B:
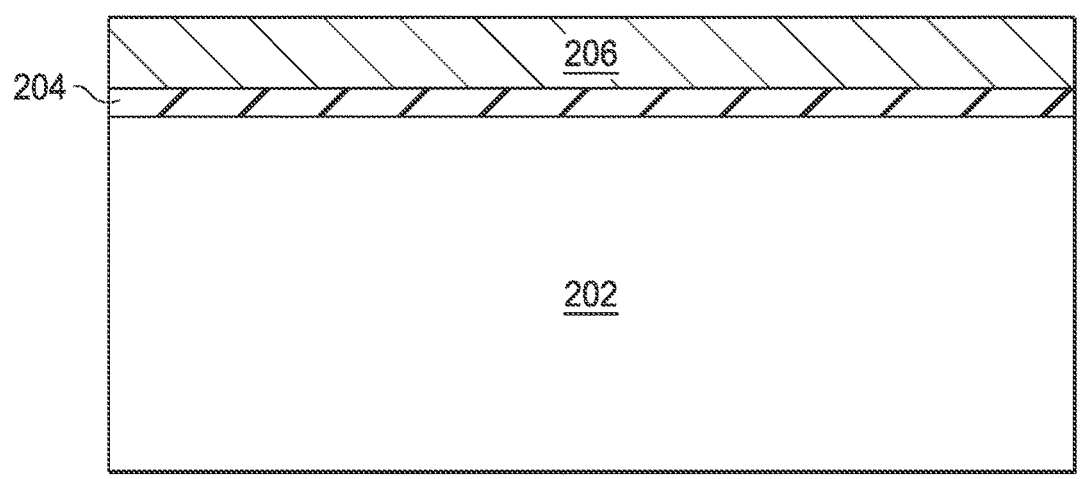

Referring to FIG. 1, the flowchart 100 includes operation 102 where a gate dielectric layer is formed over a semiconductor substrate. FIGS. 2A and 2B are top views and cross-sectional views of a wafer 200 in accordance with operation 102 of FIG. 1. A substrate 202 is provided. In some embodiments, substrate 202 is a bulk silicon substrate. In some embodiments, substrate 202 is a Silicon-On-Insulator substrate. In alternative embodiments, substrate 202 is formed of other semiconductor materials such as silicon carbide, silicon germanium, III-V compound semiconductor materials, or the like. A gate dielectric layer 204 is deposited over substrate 202. Gate dielectric layer 204 may include an oxide, a nitride, an oxynitride, a carbide, or combinations thereof. The gate dielectric layer 204 may be a thermally grown silicon oxide and may be between about 20 angstroms to 200 angstroms thick. In some embodiments, the gate dielectric layer 204 is about 70 angstroms. In some embodiments, the gate dielectric 204 is a high-k dielectric such as hafnium silicate, zirconium silicate, hafnium dioxide and zirconium dioxide.

Figure 3A:
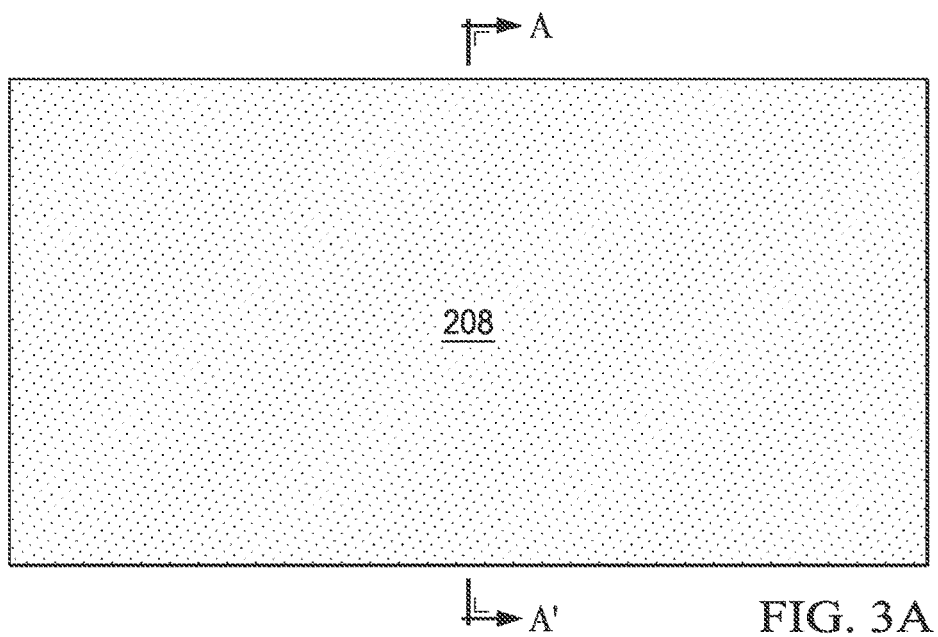
FIGS. 3A and 3B are top views and cross-sectional views of intermediate stages in the manufacturing of a device in accordance with some embodiments.
Figure 3B:
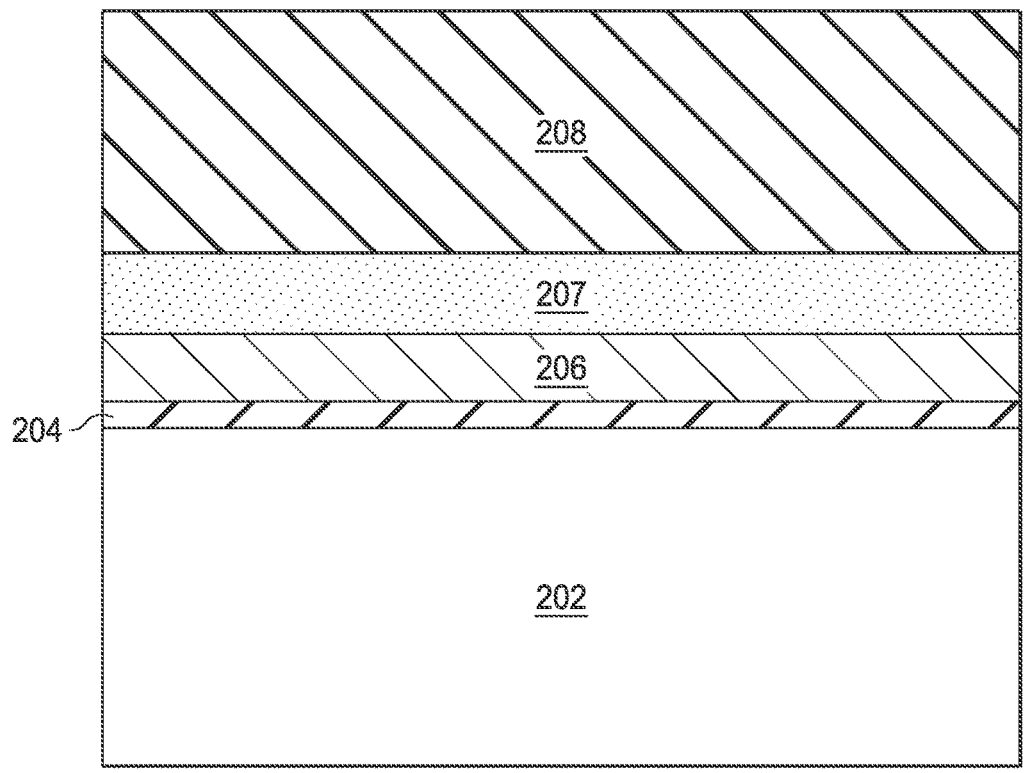

Referring to FIG. 1, in operation 104 a first gate electrode layer is formed over the gate dielectric layer. FIGS. 3A and 3B include the gate electrode layer 206 over the gate dielectric layer 204. Gate electrode layer 206 may be formed of polysilicon over a gate dielectric layer of silicon oxide. Alternatively, gate electrode layer 206 may be formed of metals such as tantalum, tungsten, tantalum nitride, and titanium nitride over a high-k dielectric layer as the gate dielectric layer 204.

Referring to FIG. 1, in operation 105 a bottom anti-reflective coating (BARC) layer is formed over the first gate electrode layer. FIG. 3B includes the BARC layer 207 over the gate electrode layer 206. The BARC layer 207 prevents radiation in a subsequent photolithographic process to reflect off layers below and interfering with the exposure process. Such interference can increase the critical dimension of the photolithography process. The BARC layer 207 is deposited using a deposition process known in the art. The thickness of the BARC layer may be specified depending on a thickness of the implant mask used to block the implant dopants in a subsequent process.

Referring to FIG. 1, in operation 106 a hardmask layer is formed over the first gate electrode layer. FIGS. 3A and 3B include the hardmask layer 208 over the gate electrode layer 206. The hardmask layer 208 is sufficiently thick to shield the gate electrode layer 206 below or at least shield gate dielectric layer 204 from ion implantation operations to form the implant isolation region. Small amounts of implantation in the gate electrode layer 206 does not affect the resulting device for polysilicon gate electrodes because the electrode doping is much higher than that of the isolation implant. For high energy ion implantations, for example, greater than about 50 keV, the hardmask layer may be greater than 1000 angstroms. In some embodiments, hardmask 208 comprises silicon nitride. In alternative embodiments, hardmask 208 is formed of other dielectric materials such as oxynitride (SiON), silicon carbide or silicon oxide.

Figure 4A:
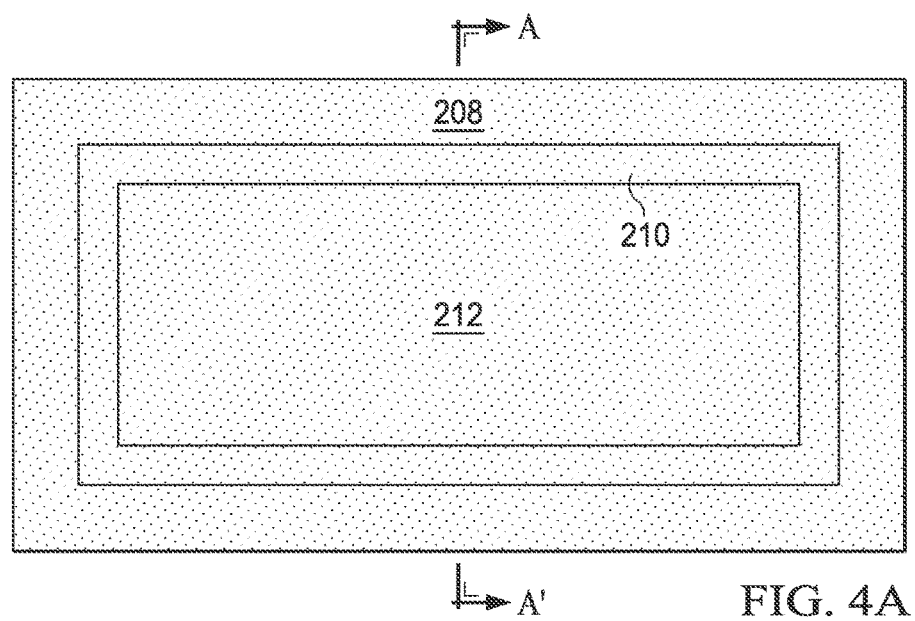
FIGS. 4A and 4B are top views and cross-sectional views of intermediate stages in the manufacturing of a device in accordance with some embodiments.
Figure 4B:
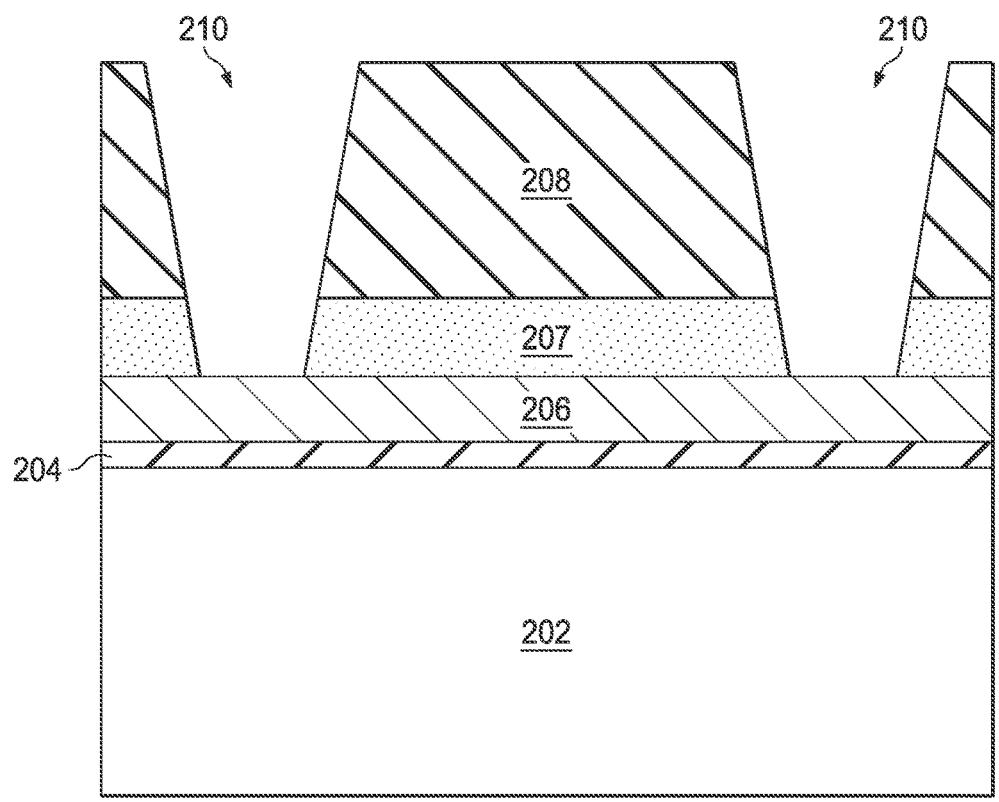

Referring to FIG. 1, in operation 108 an opening is formed in the hardmask layer to expose the first gate electrode layer or the gate dielectric layer. As shown in FIGS. 4A and 4B, hardmask 208 is patterned to form openings 210. The opening is shown as 210 that exposes the first gate electrode layer 206. A part of the gate electrode layer 206 may be removed. Openings 210, although looking like separate openings in FIG. 4B, may be parts of a continuous opening 210 around an active region 212, as shown in FIG. 4A. In some embodiments, as shown in FIG. 4A, opening 210 is rectangular. In alternative embodiments, opening 210 has other layouts and shapes, depending on the shape of the devices that is to be isolated. A photoresist is first deposited and patterned over the hardmask layer 208. After developing and removing a portion of the photoresist layer, an etch step is further preformed into the hardmask layer 208 that may remove partially or all of the gate electrode layer 206. For example, the etching of opening 210 may be performed using a fluorine based chemistry or a chlorine based chemistry, for example, carbon tetrafluoride or chlorine as the etchant.

Figure 5A:
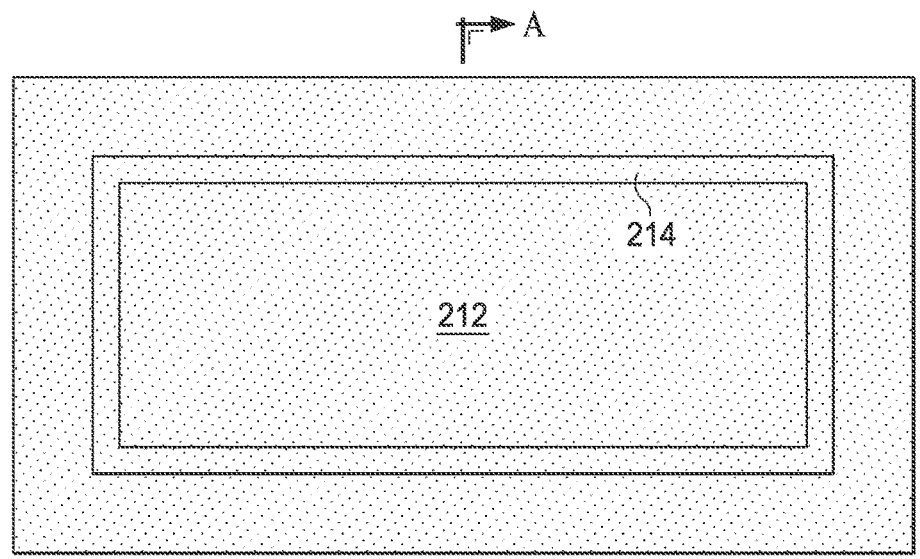
FIGS. 5A and 5B are top views and cross-sectional views of intermediate stages in the manufacturing of a device in accordance with some embodiments.
Figure 5B:
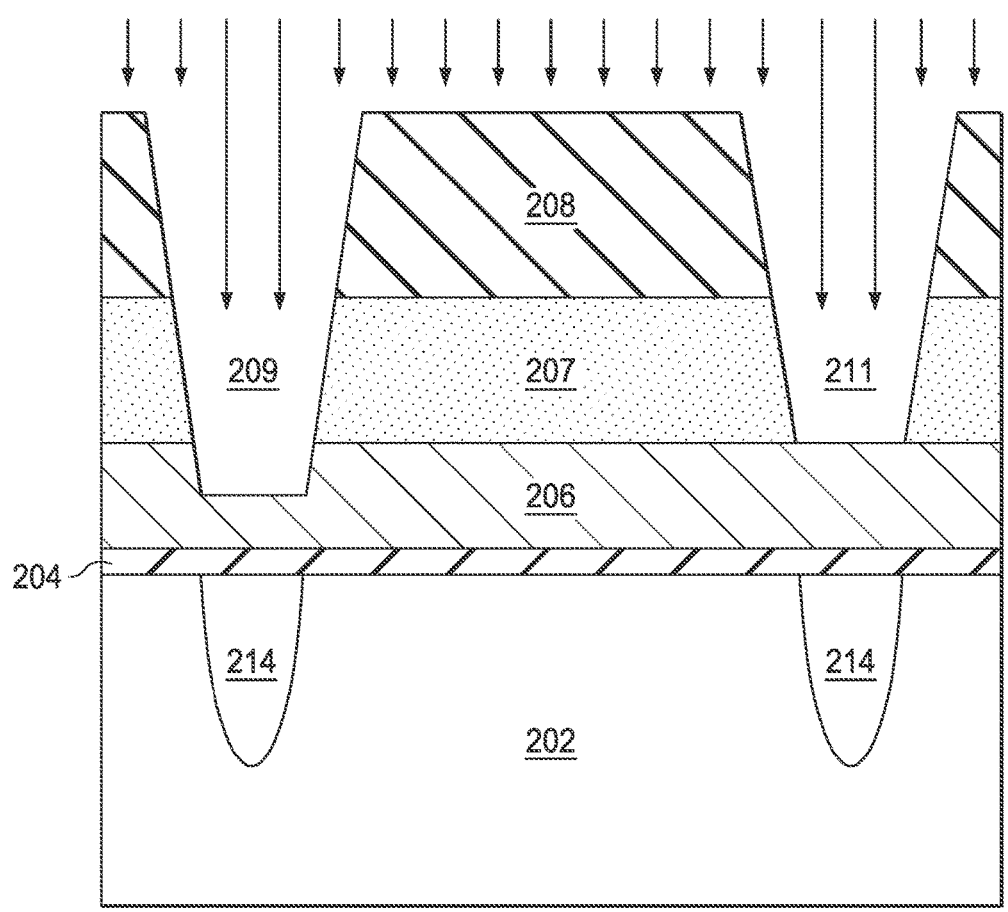

Referring back to FIG. 1, an impurity is implanted in the semiconductor substrate through the gate dielectric layer in operation 112. As shown in FIG. 5B, the impurity implanted into the semiconductor substrate forms an implant isolation region 214. As a result, active region 212 (shown in FIG. 5A), which may be used for forming a field-effect transistor (FET) device, is encircled by implant isolation regions 214. The implantation (symbolized by arrows) is performed using an energy level high enough for the implanted impurity to penetrate through the portion of gate electrode layer 206 and gate dielectric layer 204, and not high enough to penetrate through hardmask 208 over portions of gate electrode layer 206. FIG. 5B shows two types of openings in the wafer: opening 209 where a part of the gate electrode layer 206 is removed and opening 211 where the gate electrode layer is exposed. In some embodiments, the implanted impurity is a p-type impurity that, for example, comprises boron, indium, and/or the like. In alternative embodiments, the implanted impurity is an n-type impurity, for example, comprising phosphorous, arsenic, antimony, and/or the like. The conductivity type of implant isolation regions 214 is opposite of the conductivity type of active region of the device.

The hardmask 208 thickness is designed to block dopants from the implant isolation implant from reaching the gate electrode layer 206 below the BARC layer 207 while allowing a specified implant dosage to penetrate the gate dielectric layer 204 to form the implant isolation region 214. In one example, the hardmask layer 208 is a silicon oxide at about 600 nm when the implantation is boron at an energy of about 70 keV. When the implantation energy is higher, the hardmask layer 208 is correspondingly higher. Some materials for the hardmask layer 208 are better at blocking particular dopants, for example, a more dense material than silicon oxide. One skilled in the art would know to adjust the hardmask layer 208 thickness according to the implantation process parameters and the material properties of the hardmask layer.

Figure 6A:
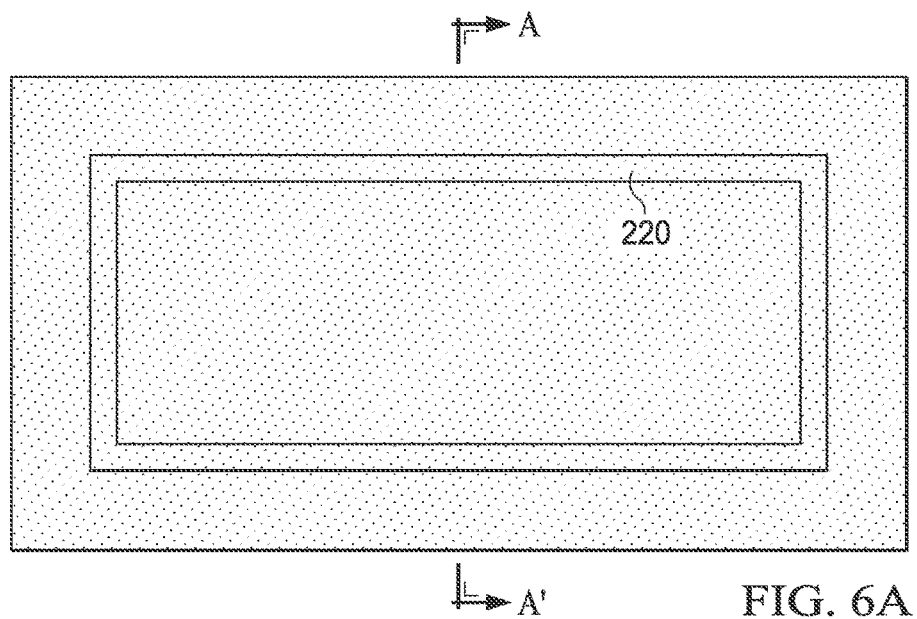
FIGS. 6A and 6B are top views and cross-sectional views of intermediate stages in the manufacturing of a device in accordance with some embodiments.
Figure 6B:
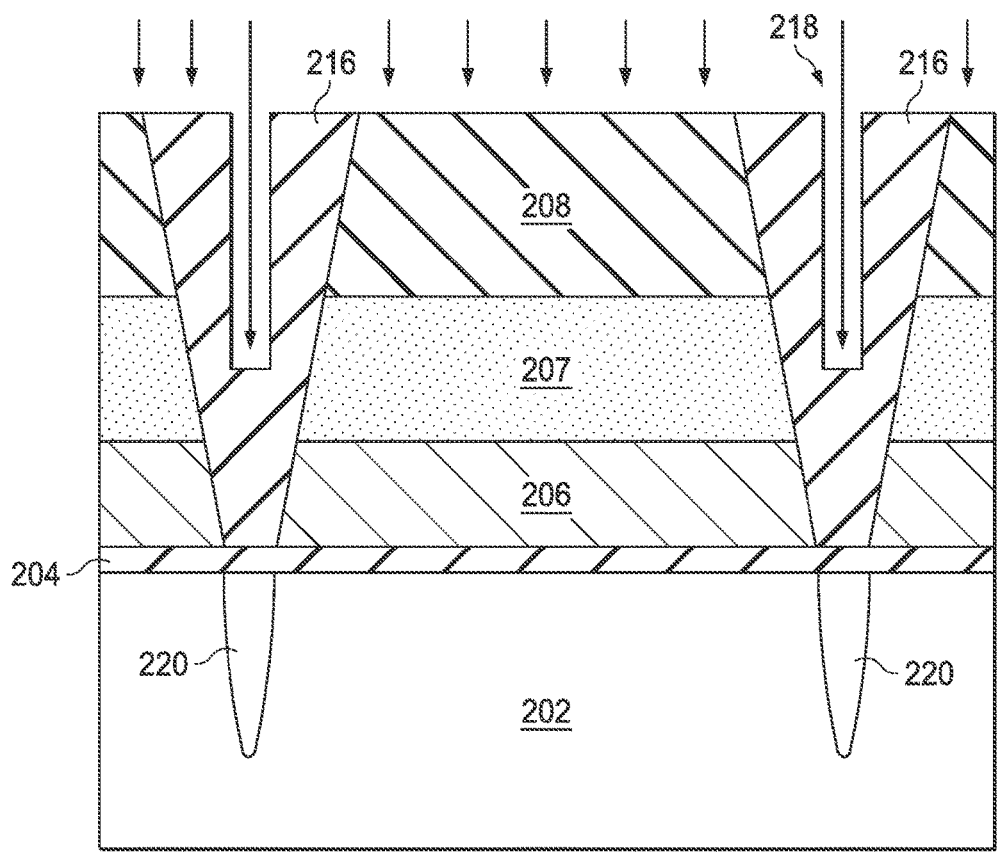

In some embodiments, an optional operation of depositing a conformal dielectric layer in the opening in the hardmask layer is performed before implanting the impurity (operation 110 of FIG. 1). As shown in FIGS. 6A and 6B, the conformal dielectric layer 216 reduces size of the opening in the hardmask layer so that a smaller opening 218 results. The subsequent ion implantation through the smaller opening 218 forms a correspondingly smaller dimensioned implant isolation region 220. Because the conformal dielectric deposits also at the bottom of the opening 218, the subsequent ion implantation parameter is tuned so that a desired amount of dopant would implant through the conformal dielectric layer 216 and the gate dielectric layer 204 to the substrate 202 below. In some embodiments, the conformal dielectric 216 and hardmask layer 208 are same material. In other embodiments, the conformal dielectric 216 and hardmask layer 208 are different materials. Reducing the dimension of the implant isolation region 220 of FIG. 6A relative to the implant isolation region 214 of FIG. 5A allows a larger active region to be used with the same silicon area, which increases the well capacity of the active region.

Figure 7A:
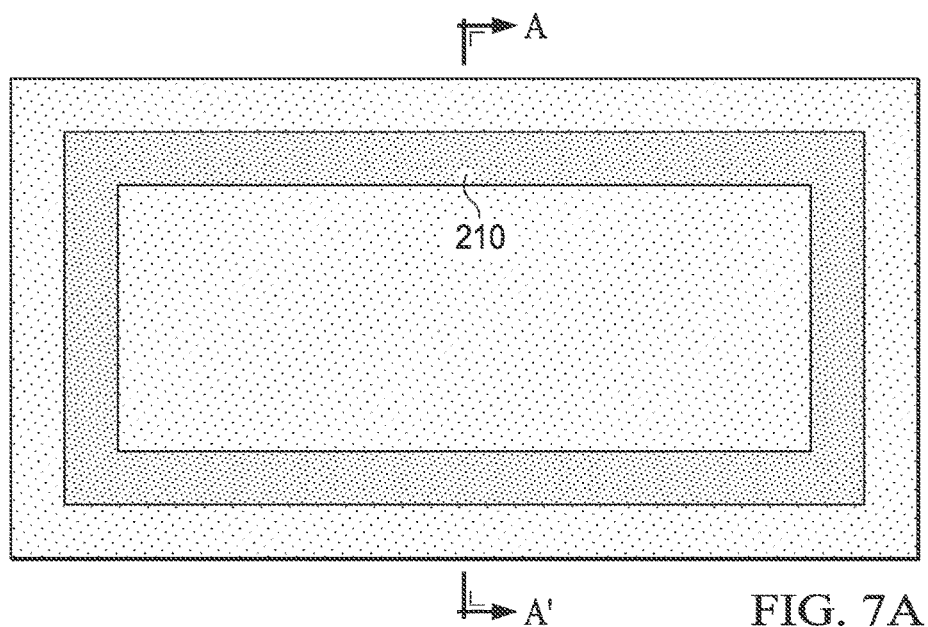
FIGS. 7A and 7B are top views and cross-sectional views of intermediate stages in the manufacturing of a device in accordance with some embodiments.
Figure 7B:
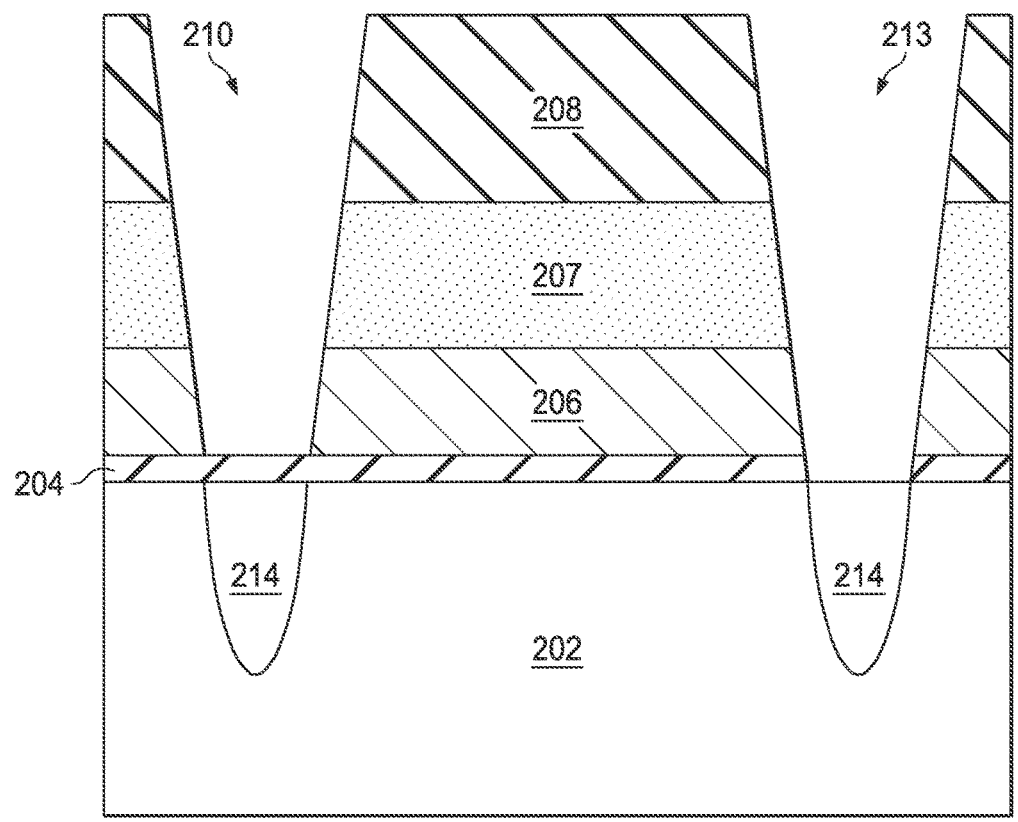

Referring back to FIG. 1, in operation 114 the first gate electrode layer in the opening is etched to expose the gate dielectric layer. To ensure complete removal of the first gate electrode layer, a portion of the gate dielectric layer may be removed also. In some cases, the gate dielectric layer is completely removed. As shown in FIGS. 7A and 7B, openings 210 and 213 are formed in the hardmask layer 208 through the first gate electrode layer 206 down to the gate dielectric layer 204. The opening 210 shows an embodiment where at least a portion of the gate dielectric layer 204 remains at the bottom of the opening while the opening 213 shows an embodiment where the gate dielectric layer is removed.

Figure 8A:
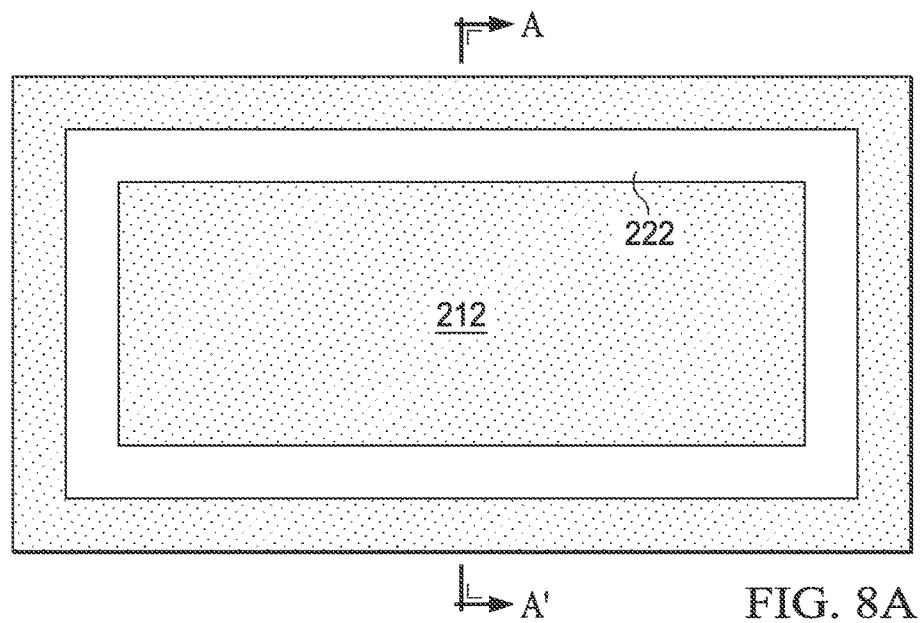
FIGS. 8A and 8B are top views and cross-sectional views of intermediate stages in the manufacturing of a device in accordance with some embodiments.
Figure 8B:
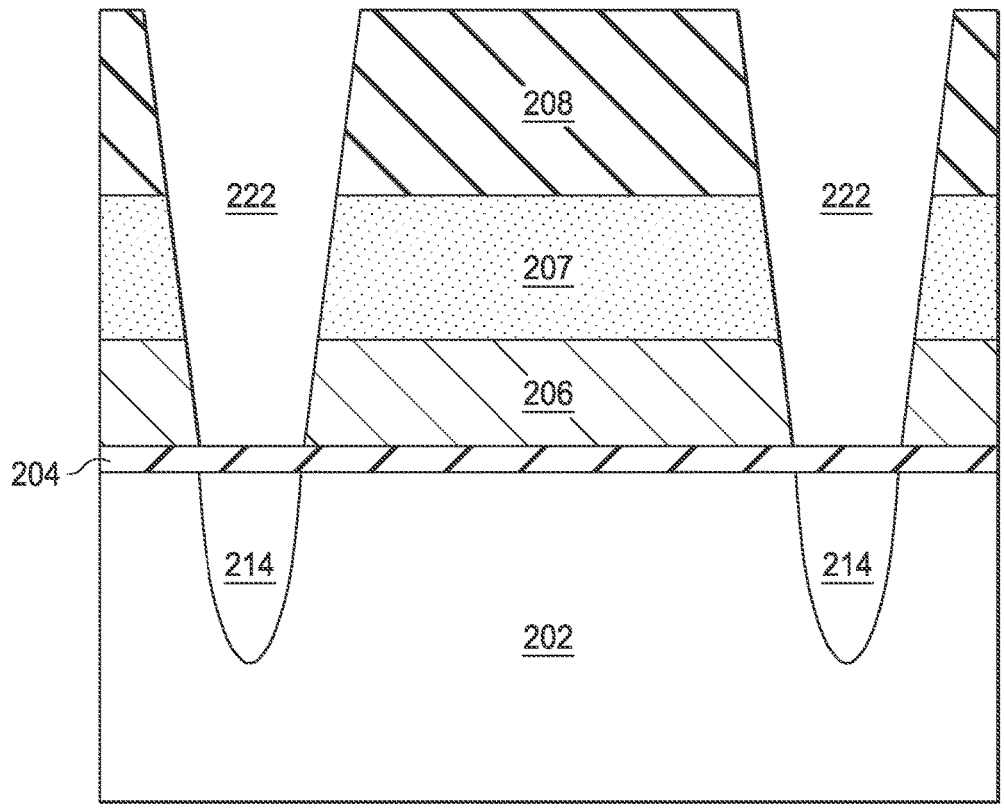

Referring back to FIG. 1, in operation 116 the opening is filled with a dielectric material. As shown in FIGS. 8A and 8B, the openings 210, 213 of FIG. 7B are filled with a dielectric material to form a dielectric ring 222 above and around the active area 212. In some embodiments, the dielectric material is a same material as the hardmask layer 208. In other embodiments, the dielectric material is different. The dielectric material may be a silicon oxide, silicon nitride, silicon oxynitride, carbon doped silicon oxide, or a metal oxide or metal nitride that would provide isolation. Although FIG. 8A does not show any dielectric material above the hardmask layer 208, in processing after the filling the openings 210, it is expected that the dielectric material would also be deposited in the field around the openings.

Figure 9A:
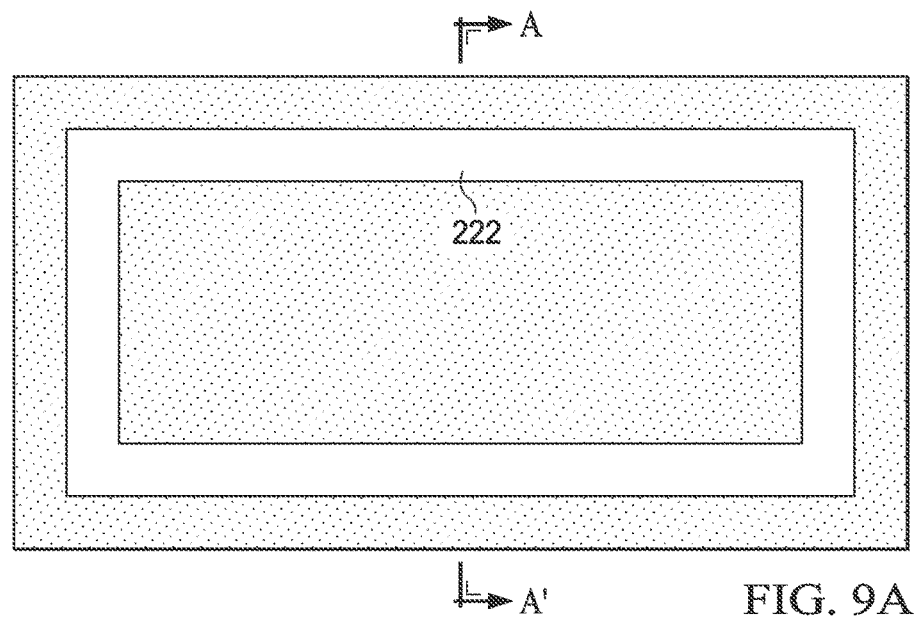
FIGS. 9A and 9B are top views and cross-sectional views of intermediate stages in the manufacturing of a device in accordance with some embodiments.
Figure 9B:
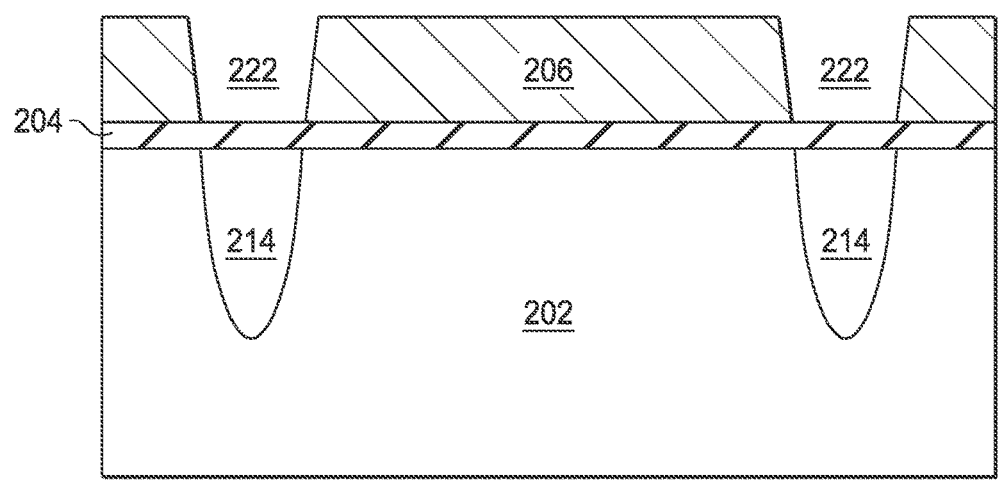

Referring back to FIG. 1, in operation 118 the hardmask layer and the dielectric material above the BARC layer are removed. In some embodiments, a chemical mechanical polishing (CMP) operation may be used to planarize the wafer down to the BARC layer. The CMP process may include chemical etchants that breaks down the hardmask layer 208 as well as mechanically polish the surface. After the planarization, the wafer has a planar surface at the BARC layer. In operation 119, the BARC layer is removed. A wet etch process may be used to remove the BARC layer, for example, with phosphor acid based etchant. Additional oxides may be removed by another wet etch using hydrofluoric acid based etchant. FIGS. 9A and 9B are top view and cross-section views of the wafer after operation 119. In the top view, an active area 212 of the first gate electrode layer 206 is surrounded by a dielectric ring 222. An implant isolation ring 214 is embedded in the semiconductor substrate 202, below and corresponding to the dielectric ring 222. The dielectric ring 222 protrudes above the first gate electrode layer 206 after the BARC layer above the first gate electrode layer 206 is removed. The height of the protrusion corresponds to the height of the BARC layer that remains after the planarization process of operation 118. A gate dielectric layer 204 is disposed between the first gate electrode layer 206/dielectric ring 222 and the substrate 202/embedded implant isolation 214. The gate dielectric layer 204 may have different thicknesses at different areas.

Figure 10A:
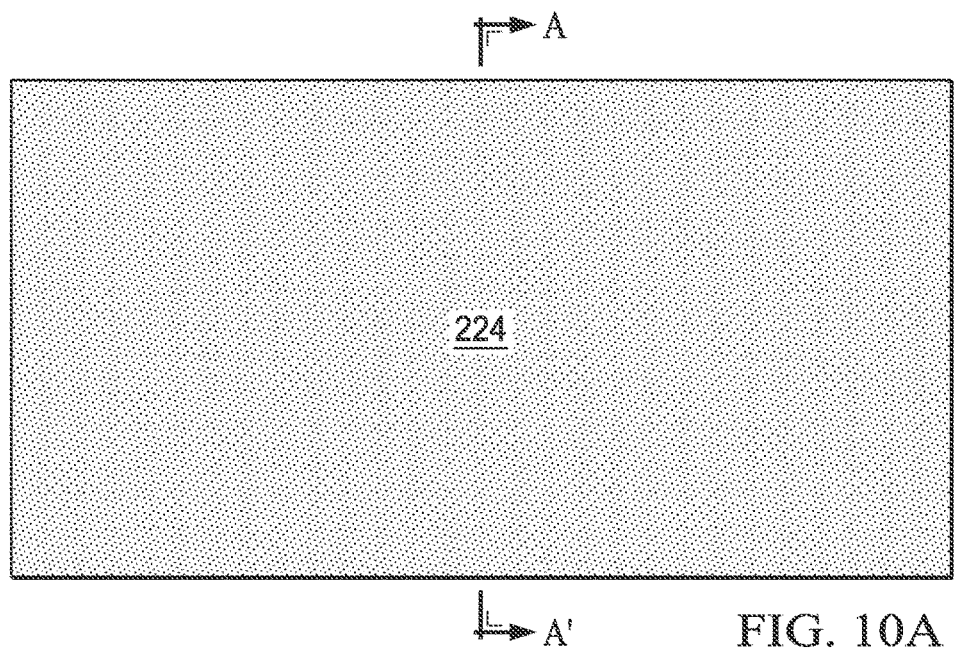
FIGS. 10A and 10B are top views and cross-sectional views of intermediate stages in the manufacturing of a device in accordance with some embodiments.
Figure 10B:
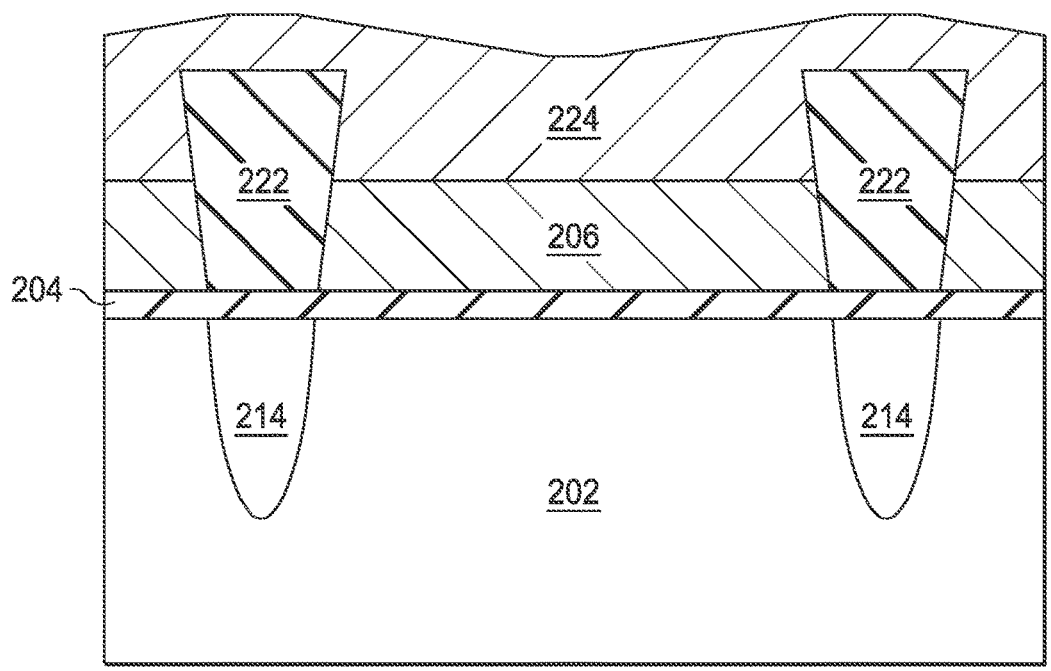

Referring back to FIG. 1, in optional operation 120 a second gate electrode layer is deposited over the first gate electrode layer. As shown in FIGS. 10A and 10B, the second gate electrode layer 224 covers the wafer. The second gate electrode layer 224 is non-planar, as shown in FIG. 10B. The second gate electrode layer 224 has a maximum height above the dielectric ring 222 and a minimum height away from the dielectric ring 222, for example, in the middle of the active region. The second gate electrode layer 224 is generally the same material as the first gate electrode layer 206. For example, if the first gate electrode layer 206 is a type of polysilicon, then the second gate electrode layer 224 is a same type of polysilicon. In some embodiments, the second gate electrode layer 224 is a different material, for example, a polysilicon with different doping amounts.

Figure 11A:
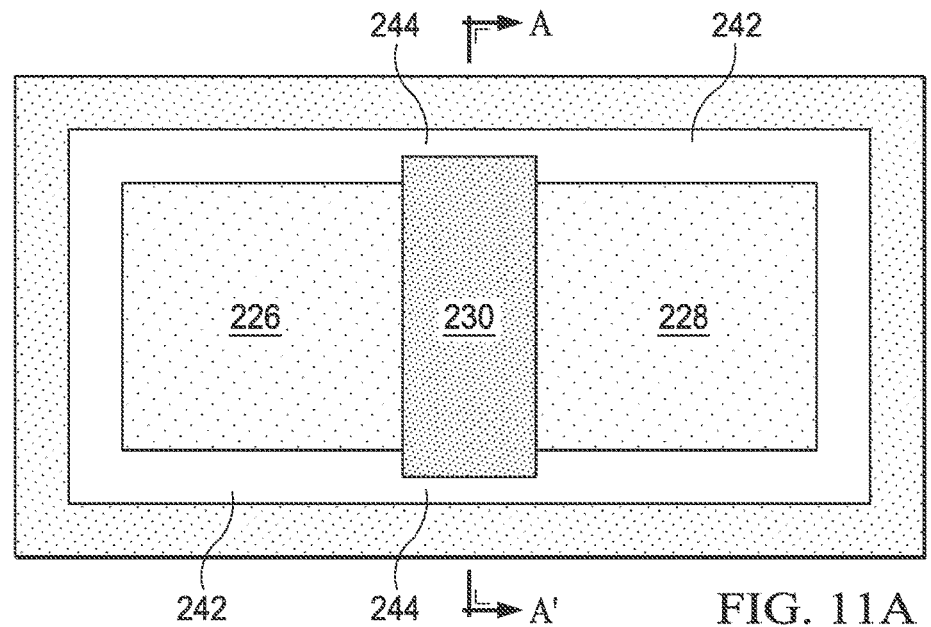
FIGS. 11A and 11B are top views and cross-sectional views of intermediate stages in the manufacturing of a device in accordance with some embodiments.
Figure 11B:
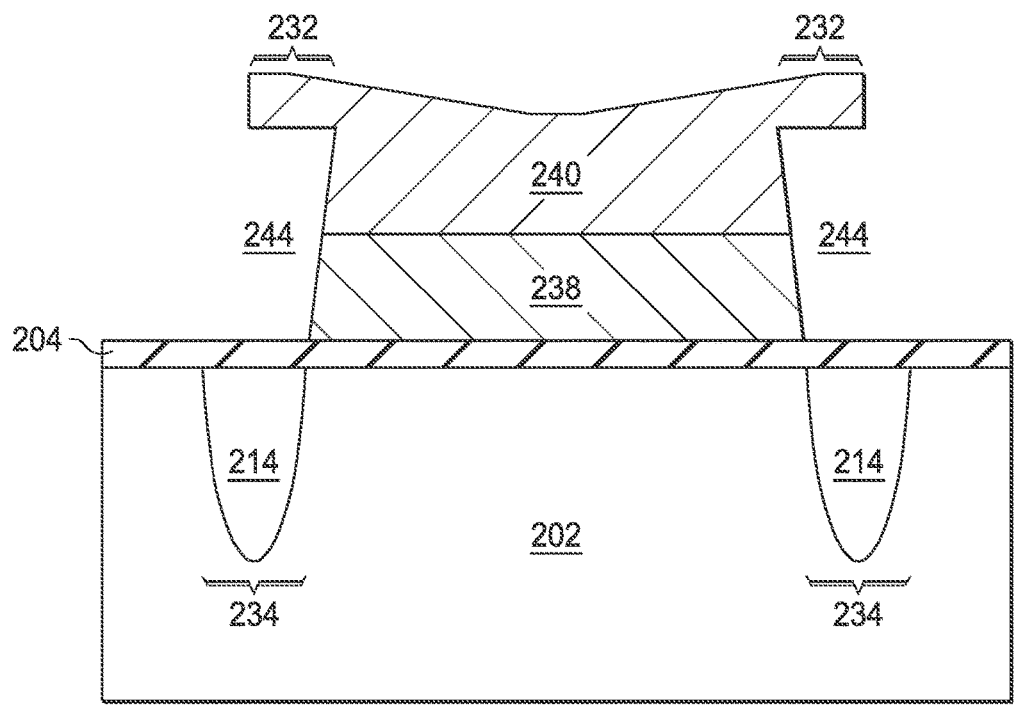

Referring back to FIG. 1, in operation 122 the gate electrode layers are patterned to form a gate electrode. The operation includes depositing a photoresist over the wafer, exposing the wafer to a light pattern, and developing the photoresist to remove unwanted portions. The wafer is then etched to remove first and second gate electrode layer material not protected by the photoresist material in one or more etch processes. As shown in FIGS. 11A and 11B, the gate electrode includes a portion of the first gate electrode layer and a portion of the second gate electrode layer that divides the active region into a source region 226, a drain region 228, and a channel region under the gate electrode 230. The dielectric ring 222 of FIG. 9A has a portion 244 under and along the gate electrode 230 and a source/drain portion 242 that surrounds the source region 226 and drain region 228. The second gate electrode layer 224 is patterned to form second gate electrode 240 that extends over all or a portion of dielectric material 244 over the implant isolation region 214. The extended portion becomes the end caps 232 of the gate electrode. The portion of dielectric material adjoining the first gate electrode layer 238 (238 references the portion of first gate electrode layer 206 remaining after patterning) is the end cap hardmask 244, which was a part of the dielectric ring 222 from FIG. 9A. While FIG. 11B shows the end cap hardmask 244 having a portion under the gate end cap 232 and a portion not under the gate end cap 232, in some embodiments, the portion not under the gate end cap 232 may be removed.

The dielectric material 242 surrounding the source region 226 and the drain region 228 is an implant mask during the source and region implantation process. Using the region 242 as a mask increases a process window for the overlay of the source and drain regions. The gate dielectric layer in the source region 226 and drain region 228 and surrounding the implant isolation region 234 may be removed in this operation or in a subsequent process. To ensure complete removal of the gate dielectric layer material from areas not covered by the photoresist, a wet etch may be used after the polysilicon dry etch.

Figure 12A:
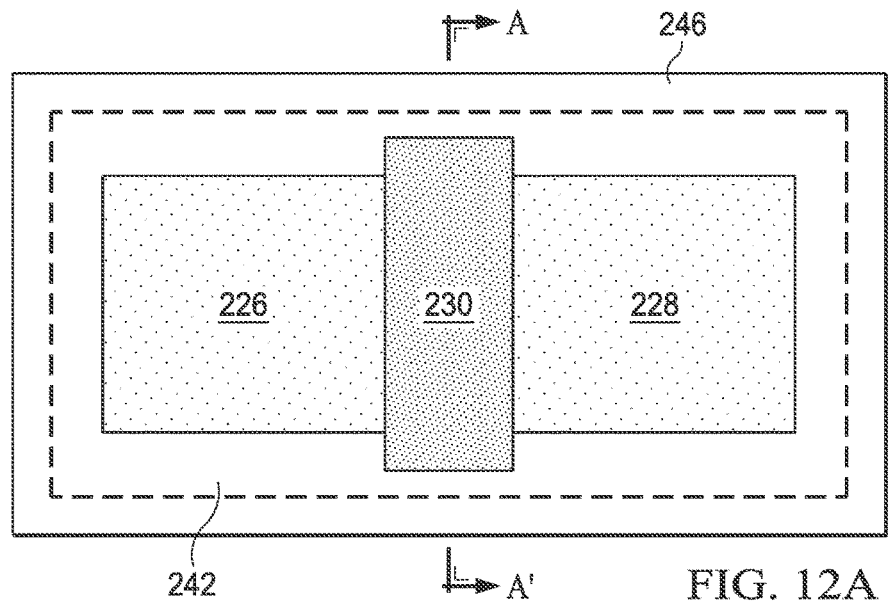
FIGS. 12A and 12B are top views and cross-sectional views of intermediate stages in the manufacturing of a device in accordance with some embodiments.
Figure 12B:
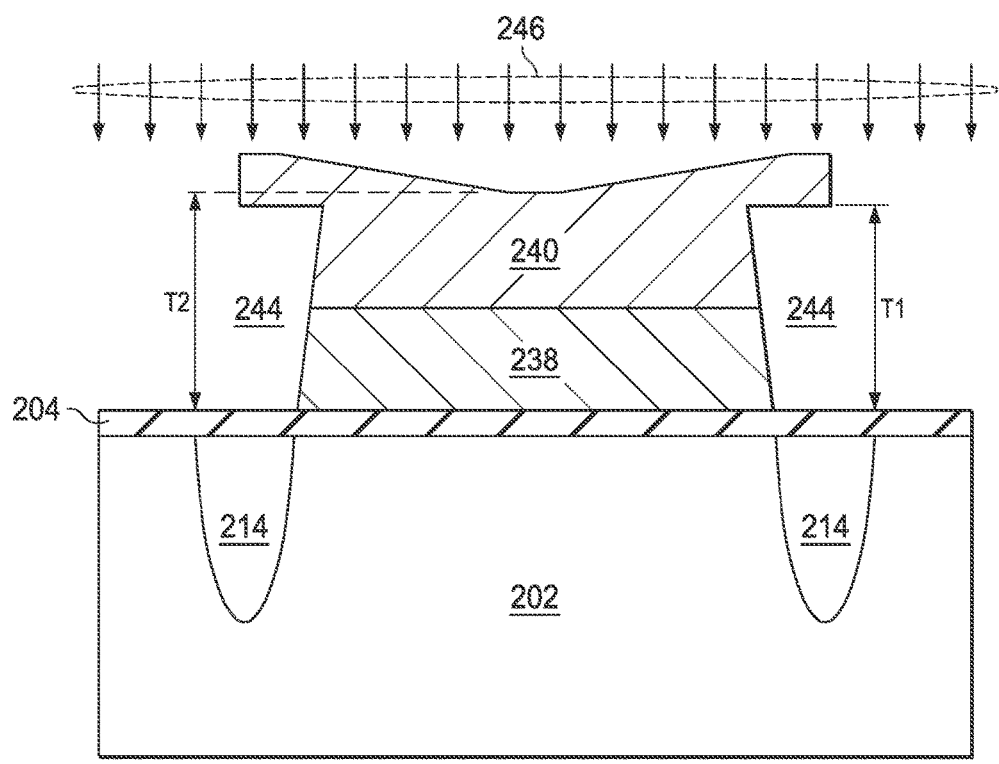

Referring back to FIG. 1, in optional operation 124 a photoresist is deposited and patterned prior to implanting the active region. As shown in FIGS. 12A and 12B, a photoresist 246 overlaps a portion of the dielectric material 242, as shown by the dashed lines around the dielectric material 242 in FIG. 12A and a portion of the end cap hardmask 244 to define the active region to be implanted. Referring back to FIG. 1, in operation 126, a source and a drain region is formed in the active region by implanting a dopant into the semiconductor substrate using the dielectric material as an implant mask. FIG. 12B includes the implantation as arrows. The dopants are implanted into the substrate 202 in the active region, in the gate electrode 230, in the dielectric material 242 surrounding the source region 226 and the drain region 228, and in the photoresist 246. The dielectric material 242 is thick enough to absorb the dopants and prevent any implantation from reaching the implant isolation region below. The thickness of the dielectric material (T1 as shown in FIG. 12B) depends on the thickness of the first gate electrode 238 and the BARC layer that was removed in operation 119. Thus, the thicknesses of these layers are designed according to the implantation energy used in operation 126.

In one example, an implantation uses a phosphorous dopant at an energy of about 15 keV. The dielectric material thickness (T1 of FIG. 12B) is at least 80 nm to block the dopants from reaching the implant isolation region below. A thickness (T2 of FIG. 12B) of the gate electrode at a minimum height of the gate electrode around the center of the gate electrode may be about 100 nm. According to various embodiments of the present disclosure, T2 may be more or less than T1, depending on the implantation requirements for various structures.

The wafer is annealed to activate various dopants. During the anneal, implantation regions diffuse and change shape when dopants migrate, thus a width of the implant isolation region, measured along a length of the gate electrode, may increase from the width as deposited. In other words, even though the implant isolation region is self-aligned with the first gate electrode layer 238 as formed, after annealing the alignment may be gone.

Referring back to FIG. 1, in optional operation 128, a portion of the dielectric material surrounding the active region is removed after implanting the active region. In some embodiments, the dielectric material portion is removed by first depositing a photoresist and patterning the photoresist, and then etching the exposed dielectric material by wet etch or dry etch. In some embodiments, the photoresist is not used and the gate electrode acts as an etch mask. In still some embodiments, the dielectric material is not removed.

Referring back to FIG. 1, in operation 130, a source contact and a drain contact over a portion of the source and drain regions are formed. Details of a source and drain region formation and contact formation are known in the art and are not described herein.

Figure 13A:
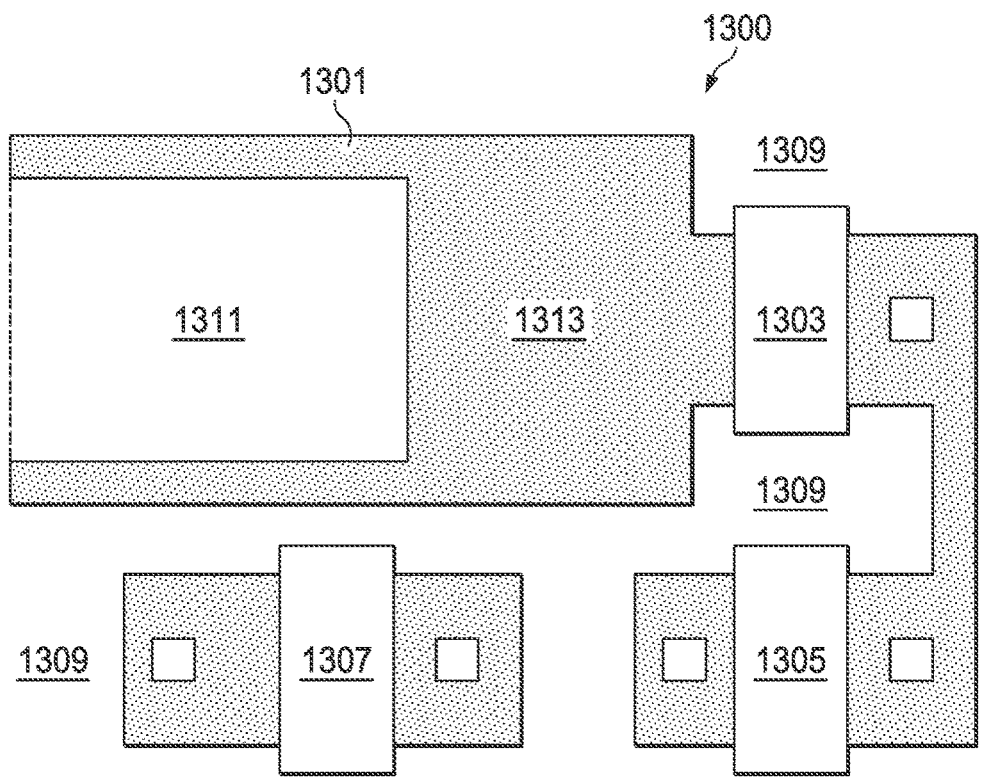
FIGS. 13A and 13B are top views and circuit diagram of a device in accordance with some embodiments.
Figure 13B:
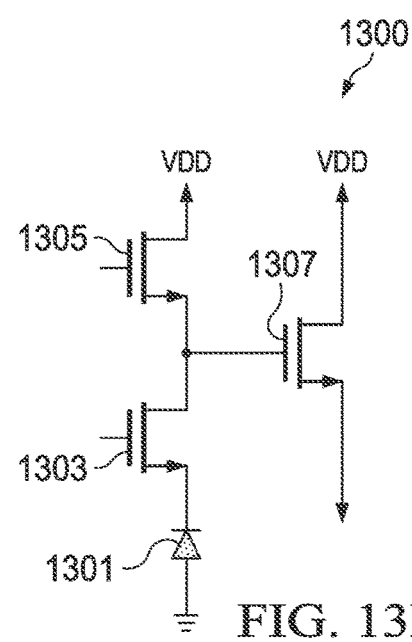

As discussed, the various embodiments of the present disclosure can be used to form different semiconductor devices. One such device is an image sensor. FIGS. 13A and 13B are a layout of an exemplary image sensor 1300 with three transistors and its circuit diagram. The image sensor 1300 includes a Photo Diode 1301, Transfer transistor 1303, reset transistor 1305, and source follower transistor 1307. Implant isolation region 1309 is formed all around the semiconductor device and between transfer transistor 1303 and reset transistor 1305, between reset transistor 1305 and source follower transistor 1307, and between source follower transistor 1307 and the photodiode 1301. For typical image sensors, the implant isolation region is p-type. The photodiode 1301 includes a deep n-well 1313 and a shallow p-well 1311 over a portion of the deep n-well 1313. As shown in the circuit diagram, the source of the transfer transistor 1303 is connected to the photodiode 1301, the drain of the transfer transistor 1303 is connected to the source of the reset transistor 1305 and to the gate of the source follower transistor 1307. The drain of both of the reset transistor 1305 and the source follower transistor 1307 are connected to a voltage supply VDD. In FIG. 13A, the connection between the drain of the transfer transistor 1303 and the source of the reset transistor 1305 is formed by extending the drain of the transfer transistor 1303 and the source of the reset transistor 1305 to overlap. The connection between the gate of the source follower transistor 1307 and the drain of the transfer transistor 1303/the source of the reset transistor 1305 is formed by utilizing a metal layer above the layout.

In accordance with some embodiments, a device includes a semiconductor substrate, and a implant isolation region extending from a top surface of the semiconductor substrate into the semiconductor substrate. A gate dielectric is disposed on a portion of the active region and the implant isolation region and includes a gate dielectric layer, two end cap hardmasks, and a gate electrode. The gate dielectric layer is disposed over the portion of the active region and at least partially over the implant isolation region. Each of the two end cap hardmasks is disposed on a portion of the gate dielectric layer over the implant isolation region. The gate electrode is disposed on at least a portion of the two end cap hardmasks and the gate dielectric layer. Because the end cap hardmasks are used as an implant mask, one or more dopant species in the active region is present in the two end cap hardmasks.

In accordance with various embodiments, the gate electrode has different thicknesses along the length of the gate structure. A minimum height of the gate electrode may be lower than a maximum h eight of the two end cap hardmasks.

In accordance with yet other embodiments, a method includes forming a gate dielectric layer, a first gate electrode layer, a bottom anti-reflective coating (BARC), and a hardmask layer over a semiconductor substrate, patterning the hardmask to form an opening in the hardmask, and etching the gate electrode layer through the opening to expose the gate electrode layer. An impurity is then implanted, wherein the impurity penetrates through a portion of the gate electrode layer to form an implant isolation region in the semiconductor substrate. The opening is filled with a dielectric material after exposing the gate dielectric layer. Various layers are removed before a second gate electrode layer is formed over the dielectric material and the first gate electrode layer. The first and second gate electrode layers are patterned to form a gate electrode and ends of the gate electrode partially overlaps the dielectric material. The dielectric material is used as an implant mask for implantation of the active region of the semiconductor substrate.

One general aspect described herein includes a device including a semiconductor substrate having an active region, an implant isolation region surrounding the active region and extending from a top surface of the semiconductor substrate into the semiconductor substrate, a gate structure on a portion of the active region and the implant isolation region, where two ends of the gate structure extend at least partially over the implant isolation region, and, where the gate structure includes a gate dielectric layer over the portion of the active region and at least partially over the implant isolation region, two end cap hardmasks, each on a portion of the gate dielectric layer over the implant isolation region, and a gate electrode disposed on at least a portion of the two end cap hardmasks and the gate dielectric layer; and, where one or more dopant species in the active region is present in the two end cap hardmasks.

Another general aspect described herein includes a device including a substrate, a source region including dopants in the substrate and a drain region including dopants in the substrate, the source region and the drain region being laterally spaced apart along a first direction in a plane of a major surface of the substrate and defining a channel region in the substrate; an annular shaped implant isolation region in the substrate, the annular shaped implant isolation region surrounding the source region, the drain region, and the channel region in the plane of the major surface of the substrate, an annular shaped dielectric hardmask overlying and substantially contiguous with the annular shaped implant isolation region, a gate electrode overlying the channel region and separated therefrom by a gate dielectric, the gate electrode having a major axis extending along a second direction perpendicular to the first direction, the gate electrode having a first sidewall over the source region, a second sidewall over the drain region, a third sidewall having a first protrusion extending over the annular shaped dielectric hardmask, and a fourth sidewall opposite the third sidewall, the fourth sidewall having a second protrusion extending over the annular shaped dielectric hardmask.

Yet another general aspect described herein includes a device including a semiconductor substrate having an active region, the active region having a rectangular periphery, an implant isolation region surrounding the periphery of the active region and extending from a top surface of the semiconductor substrate into the semiconductor substrate; dielectric feature overlying the implant isolation region and of substantially same shape as the implant isolation region, when viewed from a top down view of the substrate, a gate structure including a gate dielectric layer over the portion of the active region and at least partially over the implant isolation region, a gate electrode disposed on the gate dielectric layer, the gate electrode having a first end that includes a first sidewall in contact with a first sidewall of the dielectric feature and having an extension that extends at least partially over the dielectric feature, the gate electrode further having a second end that includes a second sidewall in contact with a second sidewall of the dielectric feature and having a second extension that extends at least partially over the dielectric features. implant isolated devices and method for forming the same Although the embodiments and their advantages have been described in detail, it should be understood that various changes, substitutions and alterations can be made herein without departing from the spirit and scope of the embodiments as defined by the appended claims. Moreover, the scope of the present application is not intended to be limited to the particular embodiments of the process, machine, manufacture, and composition of matter, means, methods and steps described in the specification. As one of ordinary skill in the art will readily appreciate from the disclosure, processes, machines, manufacture, compositions of matter, means, methods, or steps, presently existing or later to be developed, that perform substantially the same function or achieve substantially the same result as the corresponding embodiments described herein may be utilized according to the disclosure. Accordingly, the appended claims are intended to include within their scope such processes, machines, manufacture, compositions of matter, means, methods, or steps. In addition, each claim constitutes a separate embodiment, and the combination of various claims and embodiments are within the scope of the disclosure.

What is claimed is:
1. A device comprising:
a semiconductor substrate having an active region;
an implant isolation region surrounding the active region and extending from a top surface of the semiconductor substrate into the semiconductor substrate;
a gate structure on a portion of the active region and the implant isolation region, wherein two ends of the gate structure extend at least partially over the implant isolation region; and,
wherein the gate structure comprises
a gate dielectric layer over the portion of the active region and at least partially over the implant isolation region,
two end cap hardmasks, each end cap hardmask being on a portion of the gate dielectric layer and over the implant isolation region, and
a gate electrode disposed on at least a portion of the two end cap hardmasks and the gate dielectric layer; and,
wherein one or more dopant species in the active region is present in the two end cap hardmasks.

2. The device of claim 1, wherein the gate electrode has different thicknesses at a center of the gate structure and at an end of the gate structure.

3. The device of claim 1, wherein a minimum height of the gate electrode is lower than a maximum height of the two end cap hardmasks.

4. The device of claim 1, wherein a width of the end cap hardmask is equal to or less than a width of the implant isolation region along a gate electrode length.

5. The device of claim 1, wherein the gate electrode comprises a polysilicon.

6. The device of claim 1, wherein the active region is in a Metal-Oxide-Semiconductor (MOS) device, and wherein the implant isolation region and active region of the MOS device have opposite conductivity types.

7. The device of claim 1, wherein the active region comprises a portion of a photodiode and wherein the implant isolation region has p-type conductivity.

8. The device of claim 7, wherein the active region further comprises three or more transistors.

9. The device of claim 1, wherein the two end cap hardmasks comprise silicon oxide.

10. The device of claim 1, wherein the one or more dopant species are selected from the group consisting of boron, indium, phosphorous, arsenic, and antimony.

11. A device comprising:
a substrate;
a source region comprising dopants in the substrate and a drain region comprising dopants in the substrate, the source region and the drain region being laterally spaced apart along a first direction in a plane of a major surface of the substrate and defining a channel region in the substrate;
an annular shaped implant isolation region in the substrate, the annular shaped implant isolation region surrounding the source region, the drain region, and the channel region in the plane of the major surface of the substrate;
an annular shaped dielectric hardmask overlying and vertically aligned with the annular shaped implant isolation region; and
a gate electrode overlying the channel region and separated therefrom by a gate dielectric, the gate electrode having a major axis extending along a second direction perpendicular to the first direction, the gate electrode having a first sidewall over the source region, a second sidewall over the drain region, a third sidewall having a first protrusion extending over the annular shaped dielectric hardmask, and a fourth sidewall opposite the third sidewall, the fourth sidewall having a second protrusion extending over the annular shaped dielectric hardmask.

12. The device of claim 11, wherein one or more dopant species in the substrate is present in the annular shaped dielectric hardmask.

13. The device of claim 11, wherein the gate electrode has a first thickness at a center of the gate electrode and a second thickness different from the first thickness at a sidewall of the gate electrode.

14. The device of claim 11, wherein a lowest height of the gate electrode above the substrate is lower than a greatest height of the annular shaped dielectric hardmask.

15. The device of claim 11, wherein a width of the annular shaped dielectric hardmask is equal to or less than a width of the implant isolation region along the second direction.

16. The device of claim 11, wherein the gate electrode comprises polysilicon.

17. The device of claim 11, wherein the annular shaped dielectric hardmask comprise silicon oxide.

18. The device of claim 12, wherein the one or more dopant species are selected from the group consisting of boron, indium, phosphorous, arsenic, and antimony.

19. A device comprising:
a semiconductor substrate having an active region, the active region having a rectangular periphery;
an implant isolation region surrounding the periphery of the active region and extending from a top surface of the semiconductor substrate into the semiconductor substrate;
a dielectric feature overlying the implant isolation region and of substantially same shape as the implant isolation region, when viewed from a top down view of the substrate; and
a gate structure comprising:
a gate dielectric layer over a portion of the active region and at least partially over the implant isolation region, and
a gate electrode disposed on the gate dielectric layer, the gate electrode having a first end that includes a first sidewall in contact with a first sidewall of the dielectric feature and having an extension that extends at least partially over the dielectric feature, the gate electrode further having a second end that includes a second sidewall in contact with a second sidewall of the dielectric feature and having a second extension that extends at least partially over the dielectric feature.

20. The device of claim 19, wherein one or more dopant species in the active region is present in the dielectric feature.

* * * * *